United States Patent [19]
Liou

[11] Patent Number: 6,140,198
[45] Date of Patent: Oct. 31, 2000

[54] METHOD OF FABRICATING LOAD RESISTOR

[75] Inventor: Fu-Tai Liou, Hsinchu, Taiwan

[73] Assignee: United Microelectronics Corp., Hinchu, Taiwan

[21] Appl. No.: 09/187,620

[22] Filed: Nov. 6, 1998

[51] Int. Cl.$^7$ .................................................. H01L 21/20
[52] U.S. Cl. ..................... 438/382; 438/385; 438/527; 438/530; 438/330
[58] Field of Search ..................... 438/238, 382, 438/385, 330, 658, 659, 513, 522, 527, 530

[56] References Cited

U.S. PATENT DOCUMENTS

| | | | |
|---|---|---|---|
| 4,663,825 | 5/1987 | Maeda | 438/301 |
| 4,965,214 | 10/1990 | Choi et al. | 438/238 |
| 5,013,677 | 5/1991 | Hozumi | 438/330 |
| 5,218,217 | 6/1993 | Oda et al. | 257/296 |
| 5,622,884 | 4/1997 | Liu | 438/238 |
| 5,885,862 | 3/1999 | Jao et al. | 438/238 |
| 6,015,728 | 1/2000 | Chou | 438/238 |
| 6,017,790 | 1/2000 | Liou et al. | 438/240 |

FOREIGN PATENT DOCUMENTS

| | | |
|---|---|---|
| 0075874 | 6/1983 | European Pat. Off. . |
| 0463174 A1 | 1/1992 | European Pat. Off. . |
| WO 93/03500 | 2/1993 | WIPO . |

OTHER PUBLICATIONS

Keu Hong Kim, Eung Ju Oh, Jae Shi Choi; Electrical Conductivity of "Hydrogen–Reduced" Titanium Dioxide (Rutile); 1994.

D.S.Ginley, R.P. Hellmer; Polysilicon Resistor Modification with Hydrogen Plasmas on Fabricated Integrated Circuits; Journal of the Electrochemical Society, Aug. 1987.

*Primary Examiner*—Carl Whitehead, Jr.
*Assistant Examiner*—Jamie L. Davis
*Attorney, Agent, or Firm*—Hickman Coleman & Hughes, LLP

[57] ABSTRACT

A method of fabricating a load resistor. The load resistor is often applied in a static random access memory. The interconnect between different conductive regions such as gate and source/drain region is formed by applying a hydrogen treatment to a refractory metal oxide layer, while the load resistors are formed by applying a hydrogen treatment with different parameters as the former one. The insulation is formed by the refractory metal oxide layer which is not to be covered.

22 Claims, 14 Drawing Sheets

METHOD OF FABRICATING LOAD RESISTOR

BACKGROUND OF THE INVENTION

1. Field of the Invention

The invention relates in general to a method of fabricating an integrated circuit, and more particularly, to a method of fabricating a load resistor in a static random access memory (SRAM).

2. Description of the Related Art

A SRAM is a very widely used device in integrated circuit, especially in information electronic products. To fabricate a device a small dimension and a high integration is now a leading trend in manufacture. A load resistor is one of the devices comprised by a SRAM cell. Typically, the load resistor is formed of a lightly doped or undoped polysilicon section.

A circuit diagram of a SRAM cell is shown in FIG. 1. The SRAM cell comprises two load resistors $R_1$, $R_2$, two pull down transistors $Q_1$, $Q_2$, and two pass transistors $Q_3$, $Q_4$. A first polisilicon layer is employed as a gate of the transistor $Q_1$, $Q_2$, $Q_3$, and $Q_4$, and a second polysilicon is formed for load resistor. The second polysilicon layer comprises a high resistant part used as a load resistor, and a low resistant part used as an interconnect. In the prior art technique, the low resistant part, that is, the interconnect, is formed by heavily doping a part of the second polysilicon layer, while the high resistant part, that is, the load resistor, is formed by a lightly doped or undoped part of the second polysilicon layer. The interconnect and the load resistor construct a circuit path from the power source $V_{cc}$ to the nodes A and B. As mentioned above, the interconnect and the load resistors are both formed by the second polysilicon layer. The thickness of the interconnect and the load resistors are thus the same.

A conventional method for forming a load resistor of a SRAM is described as follows with reference to FIG. 2A to FIG. 2J.

In FIG. 2A, a silicon substrate 10 is provided. A transistor comprising a gate oxide layer 13, a gate 12, a source/drain region 14 and 16 and a field oxide layer 11 are formed on the substrate 10. A dielectric layer 18 is formed over the substrate 10.

In FIG. 2B, a photo-resist layer 20 with an opening exposing a part of the dielectric layer 18 over the source/drain region 14 and 16 and the gate 12 is formed.

In FIG. 2C, the exposed part of the dielectric layer 18 is removed to form vias to expose the source/drain region 14 and 16 and the gate 12.

In FIG. 2D, the photo-resist layer 20 is removed. A polysilicon layer 22 is formed. According to a prior art technique, the polysilicon layer 22 is lightly doped with dopant, or alternatively, the polysilicon layer 22 is undoped.

In FIG. 2E, a photo-resist layer 24 is formed with openings which expose portions of the polysilicon layer 22.

In FIG. 2F, the exposed polysilicon layer 22 is removed to leave an open circuit between the source/drain regions 14, 16 and the gate 12. The photo-resist layer 24 is then removed as shown in FIG. 2G.

In FIG. 2H, a photo-resist layer 26 is formed to cover portions of the polysilicon layer 22. The covered portions of the polysilicon layer 22 are to be formed as load resistors, whereas the exposed portions of the polysilicon layer 22 are to be formed as interconnects. In FIG. 2I, the exposed portions of the polysilicon layer 22 are heavily doped to reduce the resistance thereof. Thus, the interconnects comprise the conducting component 28 of $V_{cc}$, the conductive component 30 of the drain region, the conductive component 36 of the source region, and the conductive component 32 of the gate.

In FIG. 2J, the photo-resist layer 26 is removed to expose the portions of the polysilicon layer 22 as load resistors denoted as 34, 38.

In the above fabrication method for forming load resistors in a SRAM, a polysilicon layer is formed for fabricating both load resistors and interconnects. The load resistors are formed without or with light doping, while the interconnects are formed by heavily doping. As mentioned above, the load resistors are formed with the same thickness as the interconnects. As the integration increases, to form a load resistor with a sufficiently high resistance, the load resistor is commonly formed with a reduced thickness. Consequently, the thickness of the interconnects is reduced to affect the conductivity thereof.

Moreover, in the above method, the interconnects are formed by heavily doping. The heavily doped ions in the interconnects easily diffuse out of the range of the interconnect to the load resistor. The effective length of the load resistor is thus reduced and causes a reduced resistance, and therefore, affects the quality of the device.

Another method to increase the resistance of the load resistor is to increase the width. However, as the integration grows higher and higher the ability to increase the width is very restricted.

SUMMARY OF THE INVENTION

It is an object of the invention to provide a method of forming a load resistor with a sufficiently high resistance. The load resistor is formed with a limited dimension without affecting the integration requirement of the device. Moreover, the load resistor is formed by converting a refractory metal oxide layer which is also formed for fabricating an interconnect. Thus, a device with a more planar surface than a conventional one is obtained. Moreover, since the load resistor and the interconnect are formed by the same refractory metal oxide layer, the fabrication process is very much simplified.

It is another object of the invention to provide a of method forming a load resistor. Using hydrogen treatment, both the resistance of a load resistor and the conductivity of an interconnect can be adjusted as required.

To achieve the above-mentioned objects and advantages, a method of forming a load resistor is provided. A substrate having at least a conductive region is provided. An insulation layer is formed on the substrate with an opening exposing the conductive region. A refractory metal oxide layer is formed on the insulation layer and fills the opening. A two-step hydrogen treatment is performed to convert the refractory metal oxide layer into a conductor with a low resistance, a conductor with a high resistance and an insulator.

In the method mentioned above, the refractory metal oxide without being converted by a hydrogen treatment is formed as an insulator. The insulator may also be formed by selectively removing the refractory metal oxide layer.

The load resistor formed by the above method may be applied in a static random access memory, whereas the provided substrate comprises at least a metal oxide semiconductor device. The metal oxide device further comprises a gate and a source/drain region. As mentioned above, the interconnects to connect the source/drain regions, and the load resistors of a static random access memory are formed by performing hydrogen treatment to the refractory metal oxide layer.

Both the foregoing general description and the following detailed description are exemplary and explanatory only and are not restrictive of the invention, as claimed.

DESCRIPTION OF THE PREFERRED EMBODIMENTS

Figure 1:
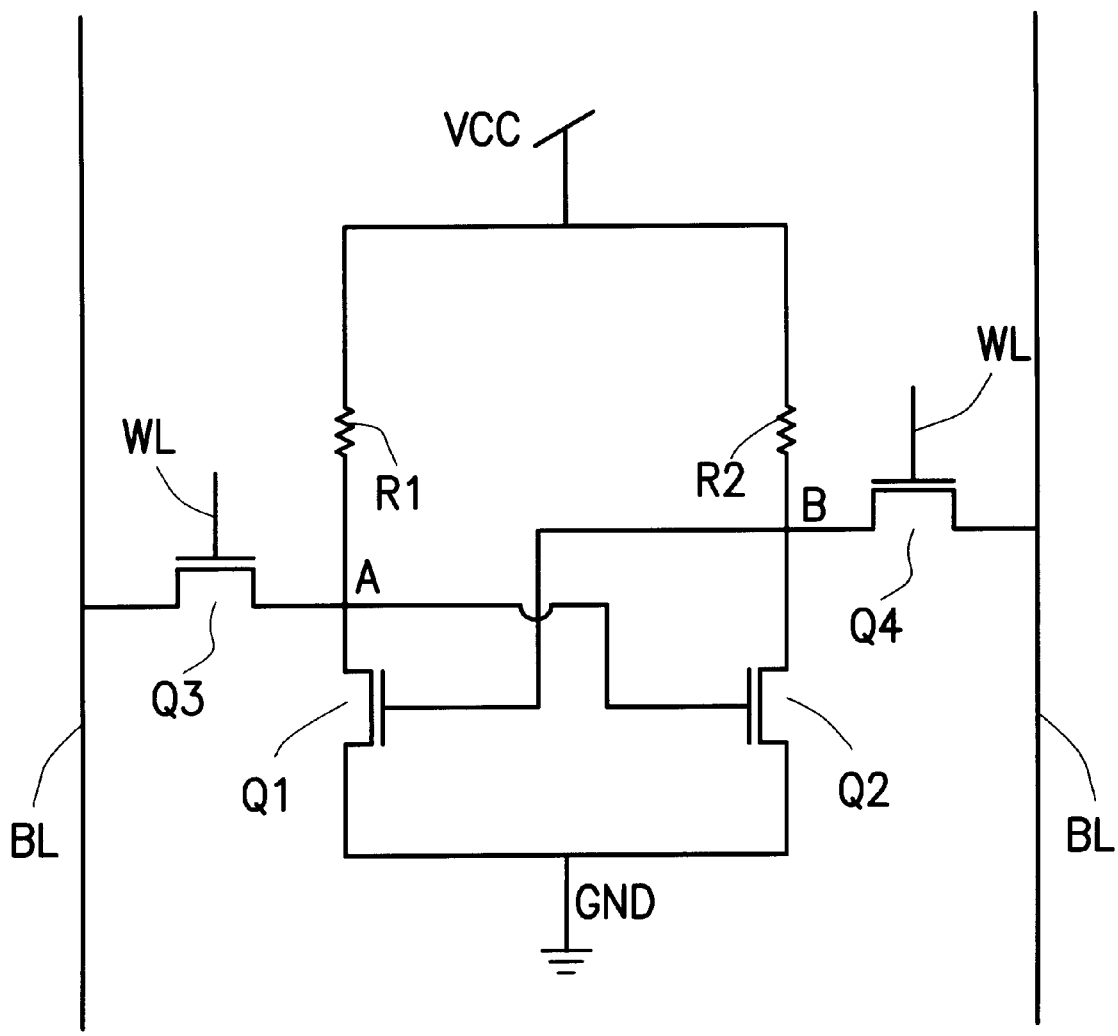
FIG. 1 shows a conventional circuit diagram of an SRAM cell.
Figure 2A:
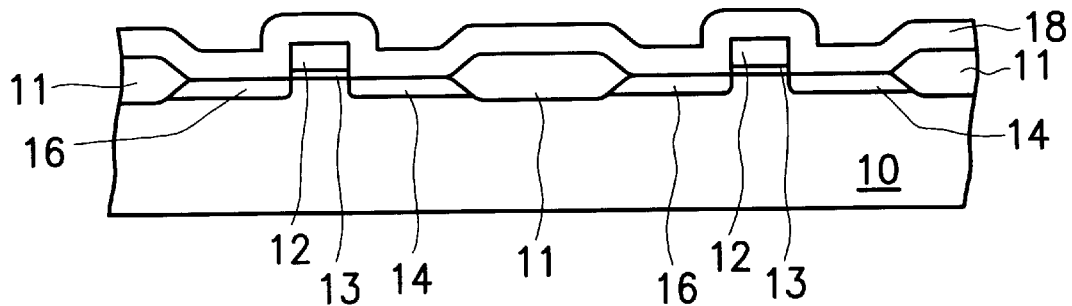
FIG. 2A to FIG. 2J shows a conventional fabrication process of forming a load resistor of an SRAM.
Figure 2B:
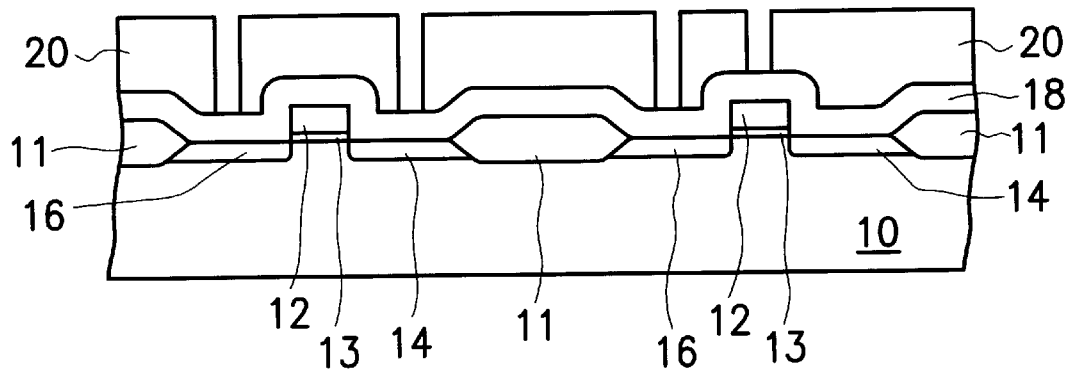
Figure 2C:
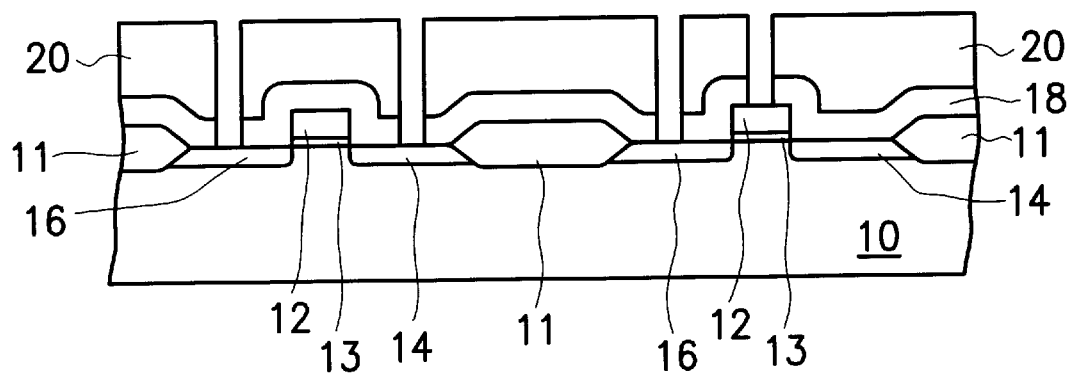
Figure 2D:
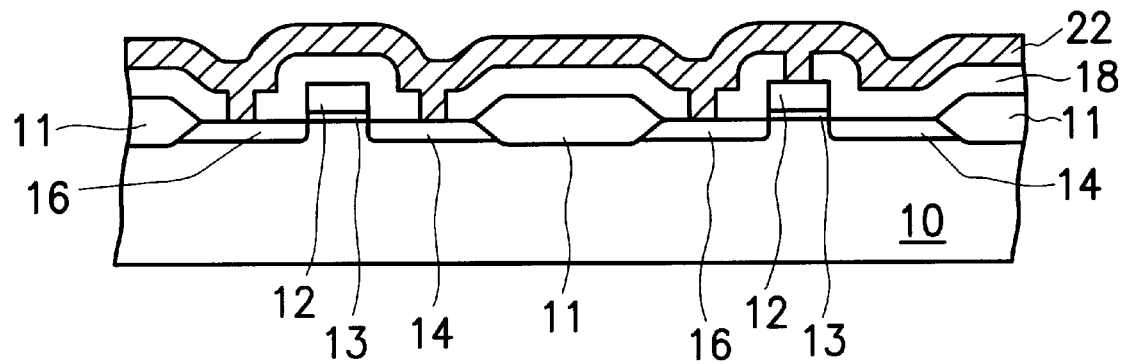
Figure 2E:
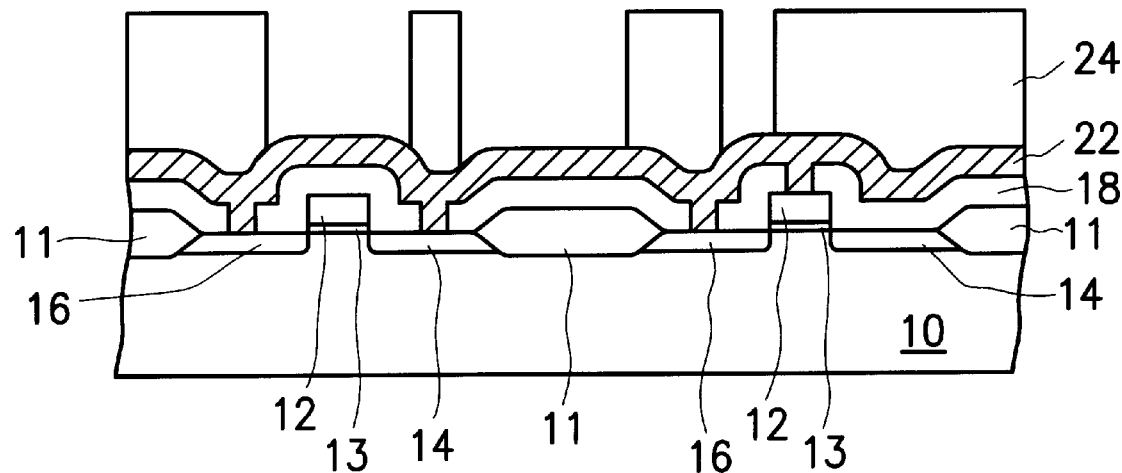
Figure 2F:
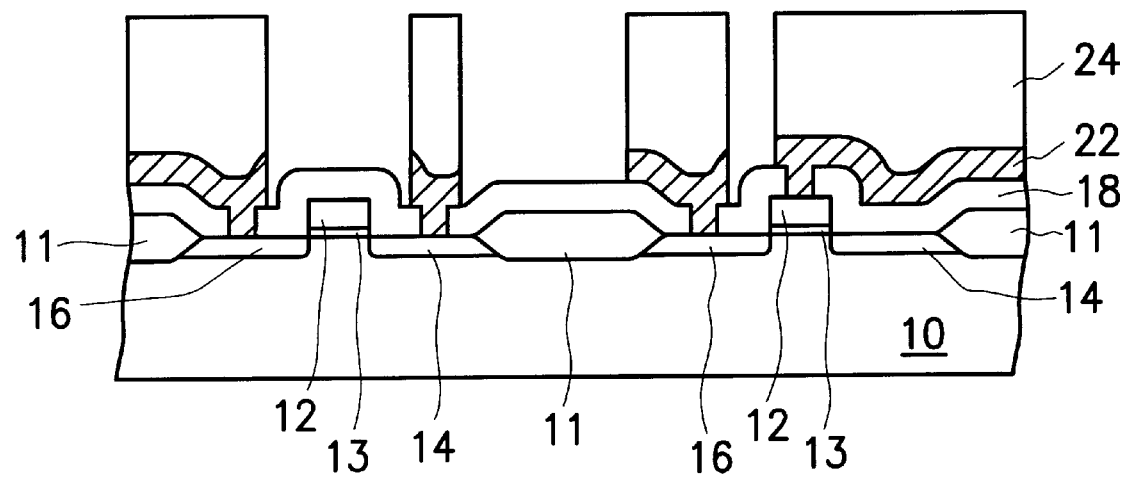
Figure 2G:
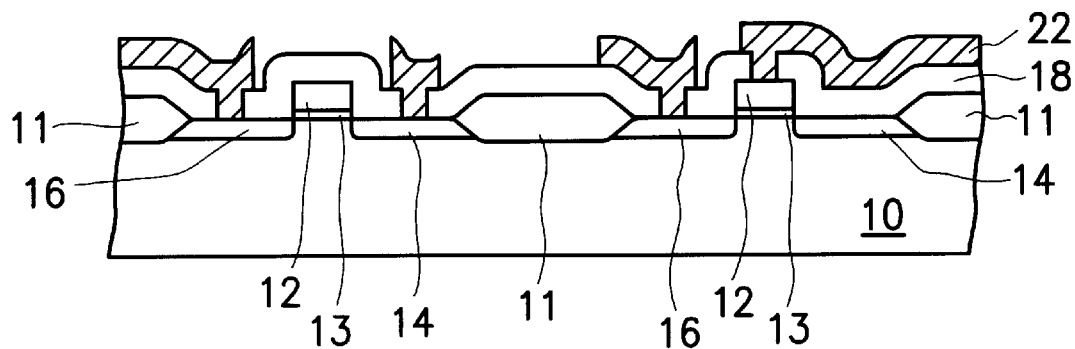
Figure 2H:
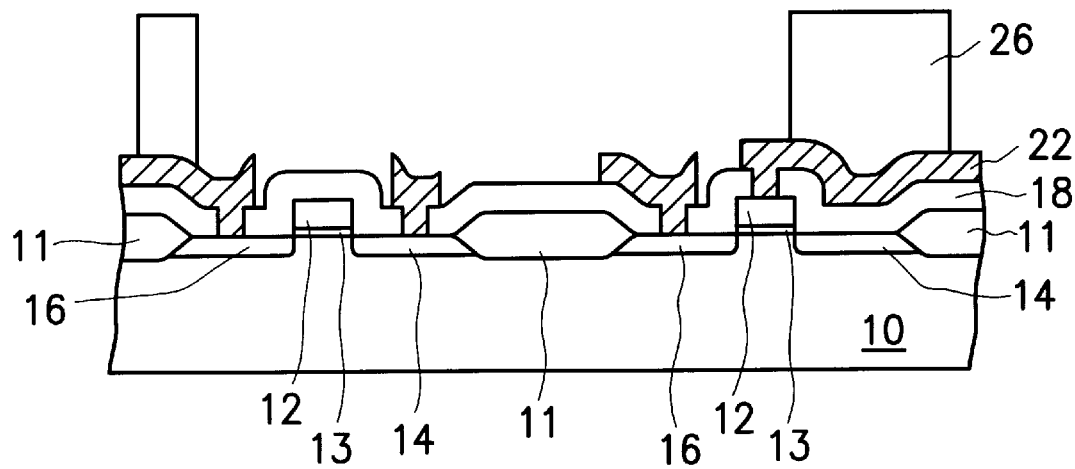
Figure 2I:
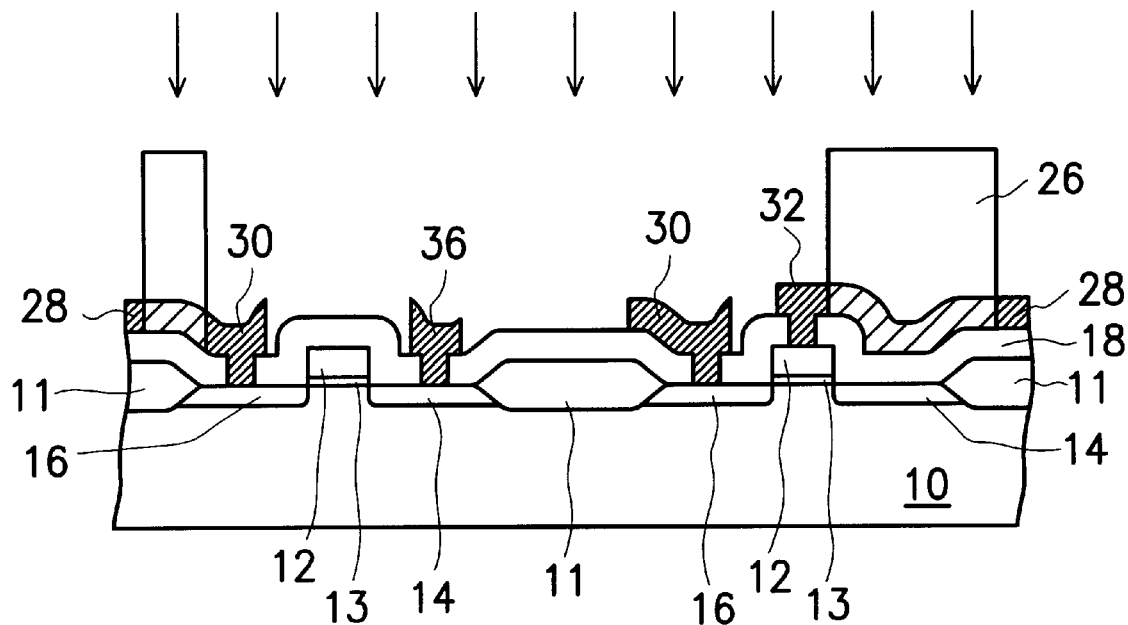
Figure 2J:
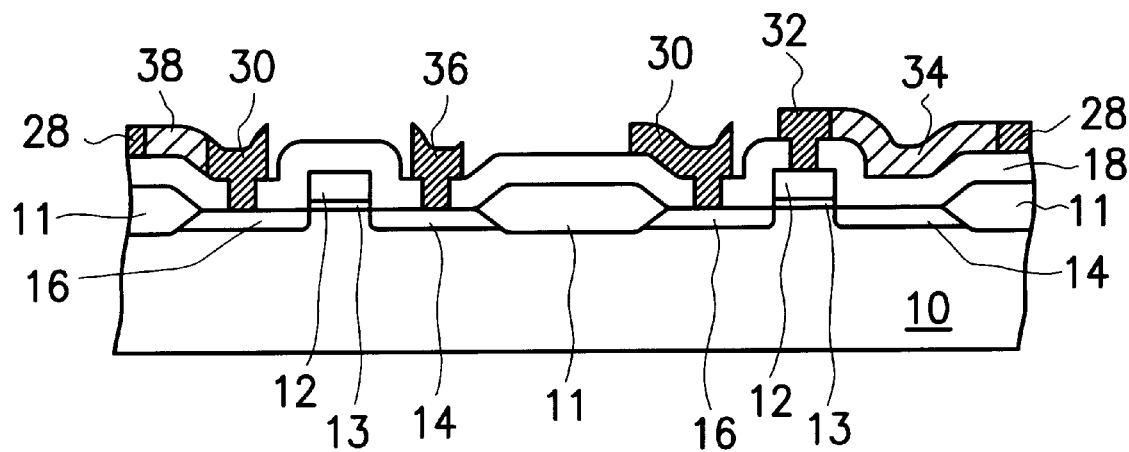

Refractory metal oxide, such as titanium oxide ($TiO_2$) tantalum oxide ($Ta_2O_5$), iron oxide ($Fe_2O_3$) and barium-titanium oxide ($BaTiO_3$), is a kind of insulator having a very wide band gap. By a hydrogen treatment, hydrogen is introduced into interstices in the atomic structure or vacancies of oxygen in the refractory metal oxide, so that the interstices and the vacancies are not occupied by oxygen in the subsequent process. Hydrogen plasma treatment or hydrogen thermal treatment is believed suitable for this hydrogen treatment, although other procedures may also work. In simpler terms, the vacancies of oxygen are various locations at which oxygen can be located in the refractory metal oxide. The hydrogen treatment causes some of these locations where oxygen can be located from being occupied by oxygen. It is believed that in the refractive metal oxide, the oxygen content is a key factor which determines the conductivity. With less oxygen content, the refractory is believed to have characteristics close to a metal. On the contrary, with more oxygen content, the refractory metal oxide is believed to have conductive characteristic close to an insulator. That is, the refractory metal oxide with less oxygen content has a higher conductivity, whereas the refractory metal oxide with more oxygen content has a lower conductivity. Furthermore, some oxygen atoms in the refractory metal oxide are believed to even be expelled and replaced by the hydrogen atoms. The reacting mechanism of expelling oxygen is represented as:

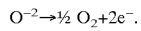

$$O^{-2} \rightarrow \tfrac{1}{2} O_2 + 2e^-.$$

As shown from the above mechanism, when an oxygen molecule is expelled or replaced, two moles of electrons are produced. These electrons are mobile charged carriers which increase the conductivity of the refractory metal oxide layer. With these mobile electrons, the refractive metal oxide is transformed from an insulator to an n-type semiconductor. If a sufficient amount of oxygen in the refractory metal oxide is expelled or replaced by hydrogen, a large amount of electrons are produced. The refractory metal oxide can even be transformed from an insulator into a conductor.

The conductivity of the refractory metal oxide depends on how much oxygen is expelled or replaced. Moreover, the conductivity of the refractory metal oxide varies with the amount of electrons produced by expelling oxygen. Using hydrogen plasma treatment or hydrogen thermal treatment, the oxygen content in the refractory metal oxide can be controlled or adjusted. Consequently, the conductivity, or the resistance, of the refractory metal oxide can be adjusted to a predetermined level. The more the hydrogen treatment decreases the oxygen content, the greater the conductivity and the lower the resistance. This also indicates that a longer operation time of the hydrogen plasma treatment is needed to achieve a lower resistance, since more oxygen atoms are to be expelled.

The method of introducing hydrogen into the refractory metal oxide to adjust the conductivity is described in more detail in "Semiconductor Electrodes for Photo-electrolysis, p. 151, State University of New York, 1982" by Fu-Tai Liou, "Solid Electro-chemical Modification of Semiconductors, Solid State Comm., Vol. 43, No. 8, pp. 633–636 by C. Y. Yang et al.", and "Photo-electrolysis at $Fe_2O_3/TiO_2$ Hetero-junction Electrode, Journal of the Electrochemical Society, Vol. 129, No. 2, pp. 342–345, 1982" by Fu-Tai Liou, each of which is incorporated herein in full by reference.

FIG. 3A to FIG. 3F show a preferred embodiment of fabricating a load resistor of a SRAM.

Figure 3A:
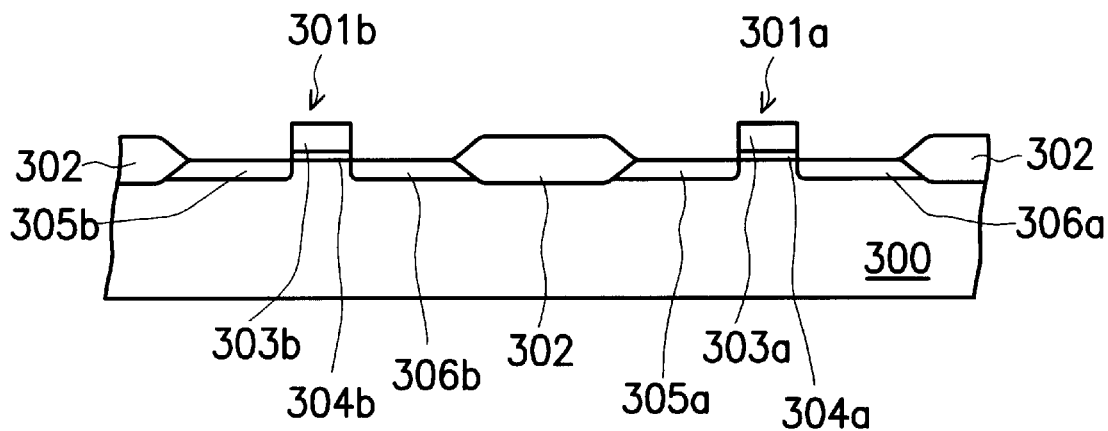
FIG. 3A to FIG. 3F shows a fabrication process of forming a load resistor of a SRAM in a preferred embodiment according to the invention.

In FIG. 3A, semiconductor devices 301a, 301b, and a field oxide layer 302 are formed on a substrate 300. In this embodiment, transistors are used as an example for the semiconductor devices 301a and 301b. The transistor 301a comprises a gate 303a, a gate oxide layer 304a, and source/drain regions 305a, 306a. Whereas, the transistors 301b comprises a gate 303b, a gate oxide layer 304b, and source/drain region 305b, 306b.

Figure 3B:
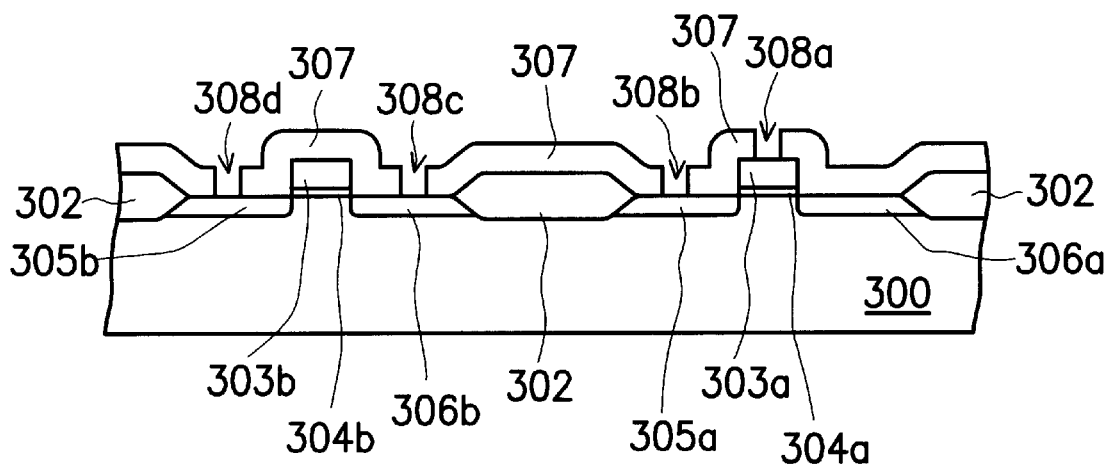

In FIG. 3B, an insulation layer 307 is formed over the substrate 300. The insulation layer comprises openings 308a, 308b, 308c, and 308c exposing the gate 303a, the source/drain regions 305a, 306b, and 305b, respectively.

Figure 3C:
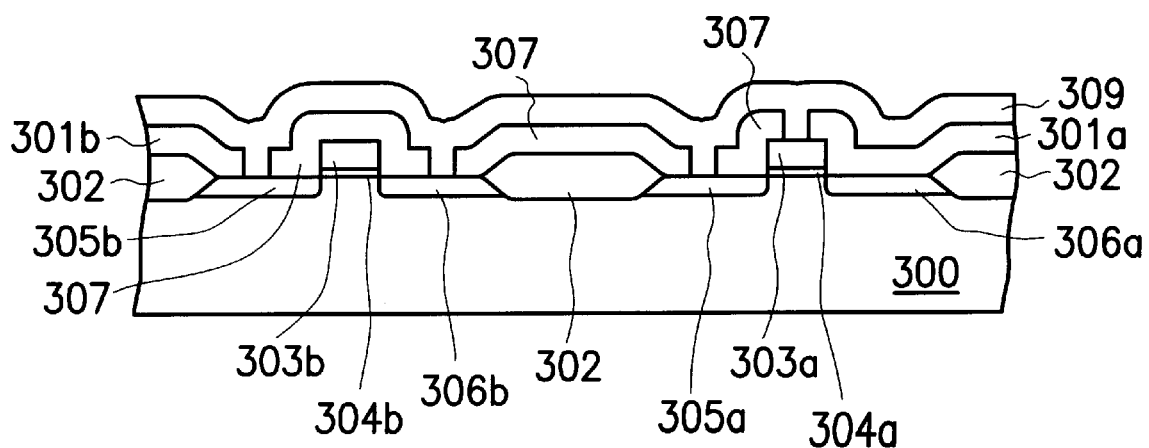

In FIG. 3C, a refractory metal oxide layer 309, for example, a $TiO_2$, $Ta_2O_5$, $Fe_2O_3$, or $BaTiO_3$ layer, is formed on the insulation layer 307. The refractory metal oxide layer 309 also fills the openings 308a, 308b, 308c, and 308d to connect with the gate 303a and the source/drain regions 305a, 306b, and 305b. A two-step hydrogen treatment is then performed to convert the refractory metal oxide layer 309 from a high resistant material to a conductor with a high resistance and a conductor with a low resistance. This two-step hydrogen treatment is as follows.

Figure 3D:
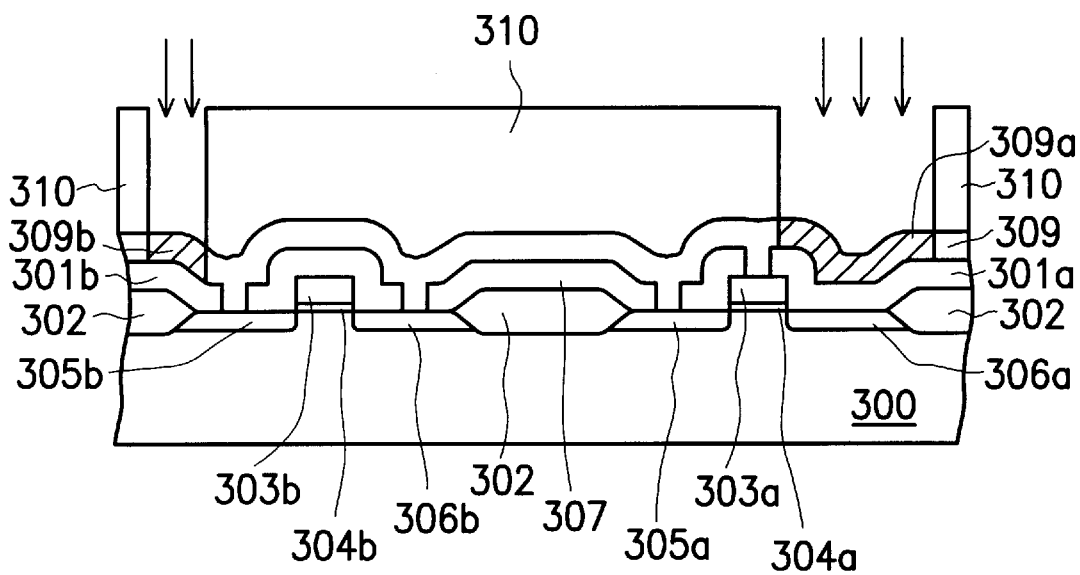

In FIG. 3D, a first mask layer 310 is formed on the refractory metal oxide layer 309. As shown in the figure, portions of the refractory metal oxide layer 309 are exposed, while the other portions of the refractory metal oxide layer 309 are covered by the first mask layer 310. A first step of hydrogen treatment is performed to the exposed refractory metal oxide layer 309. Therefore, the exposed refractory metal oxide 309 is converted from an insulator to a conductor with a high resistance. The converted portions are used as load resistors in a SRAM and denoted as 309a and 309b.

Figure 3E:
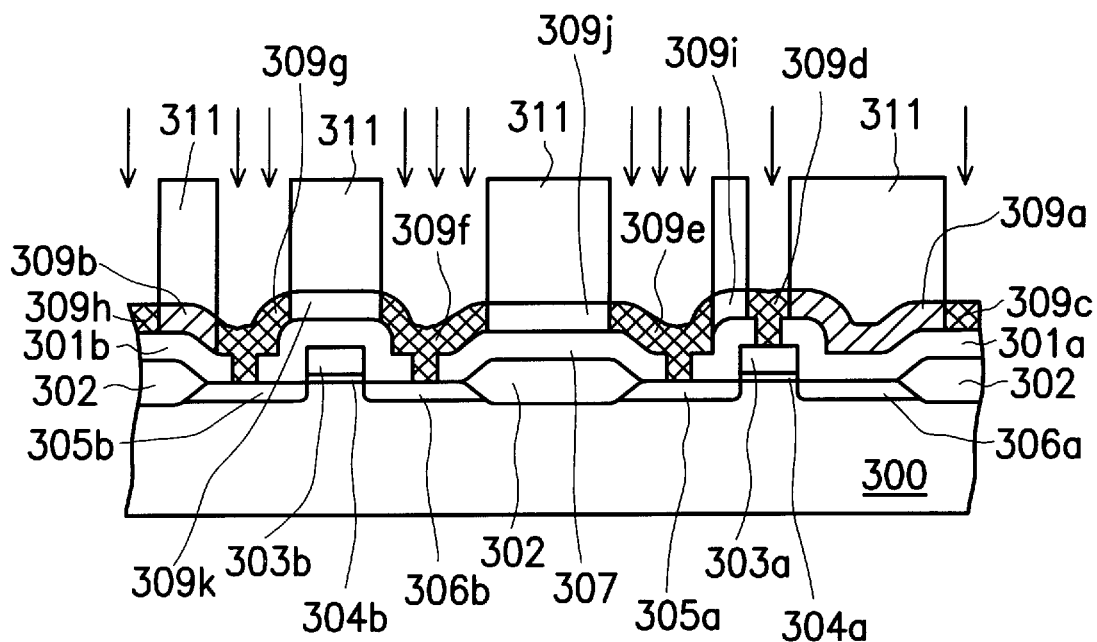
Figure 3F:
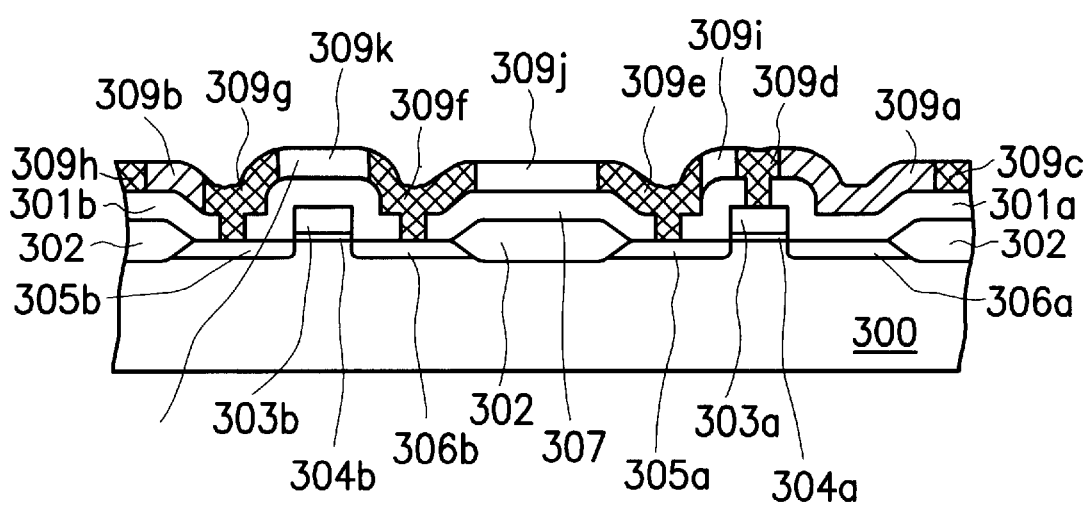

In FIG. 3E, the mask layer 310 is removed. A second mask layer 311 is formed on the refractory metal oxide layer 309. A second hydrogen treatment is performed to convert portions of the refractory metal oxide layer 309 exposed by the second mask layer 311. The converted portions become conductors with a low resistance denoted as 309c, 309d, 309e, 309f, 309g, and 309h and can be used as interconnects in a SRAM in this embodiment, while portions covered by the second mask layer 311 remain as insulators denoted as 309i, 309j, and 309k. The second mask layer 311 is then removed as shown in FIG. 3F. As a result, the load resistors 309a and 309b and the interconnects 309c to 309h are formed with a much more planar surface of the substrate 300 compared to a conventional SRAM. The more planar surface is advantageous to the subsequent fabrication process. Moreover, in the conventional process, when a load resistor with a high resistance is required, it is often that the load resistor is formed with a reduced thickness. Consequently, the thickness of the interconnects is reduced to affect the conductivity thereof.

FIG. 4A to FIG. 4F show another preferred embodiment of fabricating a load resistor of a SRAM.

Figure 4A:
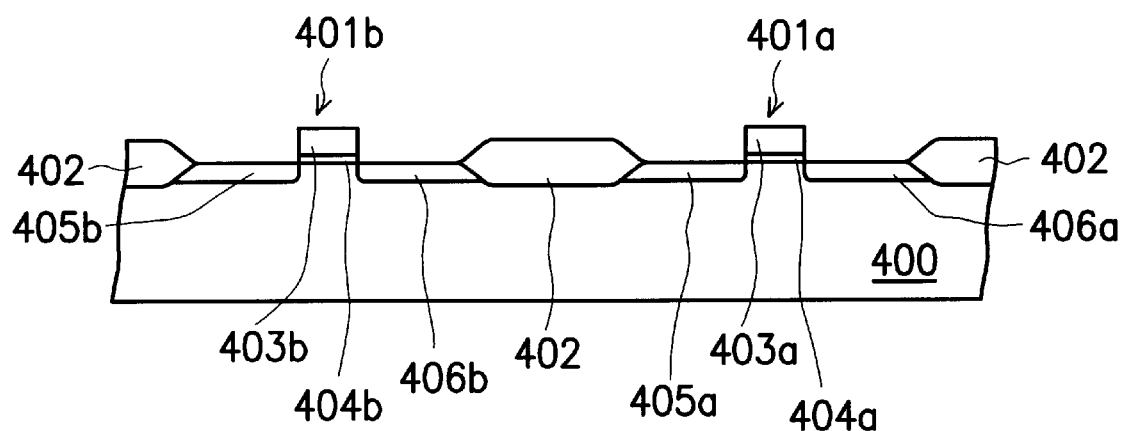
FIG. 4A to FIG. 4F shows a fabrication process of forming a load resistor of a SRAM in another preferred embodiment according to the invention; and FIG. 5A to FIG. 5F shows a fabrication process of forming a load resistor of a SRAM in another preferred embodiment according to the invention.

In FIG. 4A, semiconductor devices 401a, 401b, and a field oxide layer 402 are formed on a substrate 400. In this embodiment, transistors are used as an example for the semiconductor devices 401a and 401b. The transistor 401a comprises a gate 403a, a gate oxide layer 404a, and source/drain regions 405a, 406a. The transistor 401b comprises a gate 403b, a gate oxide layer 404b, and source/drain region 405b, 406b.

Figure 4B:
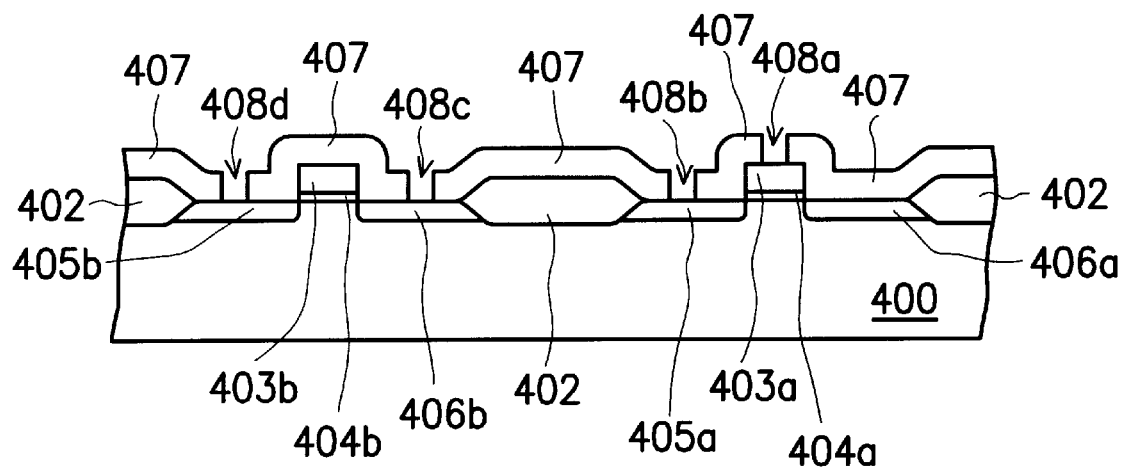

In FIG. 4B, an insulation layer 407 is formed over the substrate 400. The insulation layer comprises openings 408a, 408b, 408c and 408d exposing the gate 403a, the source/drain regions 405a, 406b, and 405b, respectively.

Figure 4C:
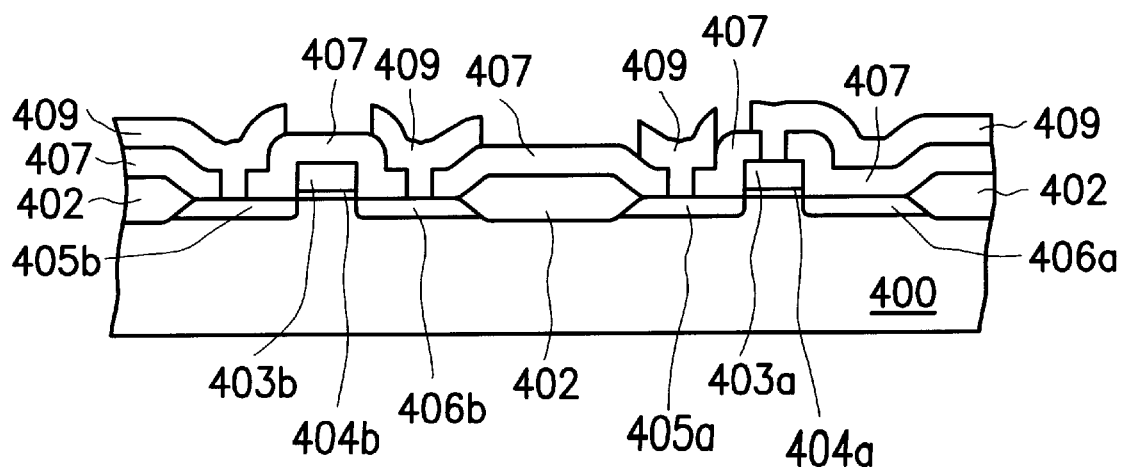

In FIG. 4C, a refractory metal oxide layer 409, for example, a $TiO_2$, $Ta_2O_5$, $Fe_2O_3$, or $BaTiO_3$ layer, is formed on the insulation layer 407. The refractory metal oxide layer 409 also fills the openings 408a, 408b, 408c, and 408d to connect with the gate 403a and the source/drain regions 405a, 406b, and 405b. Using photolithography and etching, the refractory metal oxide layer 409 is selectively removed. The removal of the refractory metal oxide layer 409 thus forms a insulator. That is, any unwanted connection between interconnects, load resistors, or the source/drain region are thus prevented. A two-step hydrogen treatment is then performed to convert the refractory metal oxide layer 409 from a high resistant material to a conductor with a higher resistance and a conductor with a low resistance. This two-step hydrogen treatment is introduced in detailed as follows.

Figure 4D:
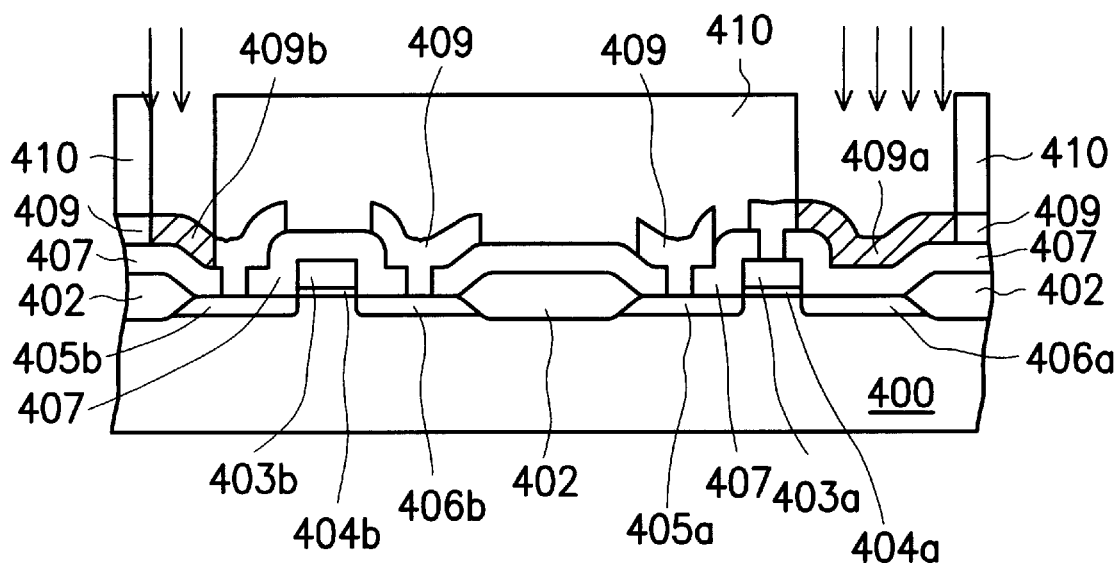

In FIG. 4D, a first mask layer 410 is formed on the refractory metal oxide layer 409. As shown in the figure, portions of the refractory metal oxide layer 409 are exposed, while the other portions of the refractory metal oxide layer 409 are covered by the first mask layer 410. A first step of hydrogen treatment is performed to the exposed refractory metal oxide layer 409. Therefore, the exposed refractory metal oxide 409 is converted from an insulator to a conductor with a high resistance. The converted portions are used as load resistors in a SRAM and denoted as 409a and 409b. In this step, the first mask layer 410 is used both as a photo-resist layer and a diffusion barrier layer.

Figure 4E:
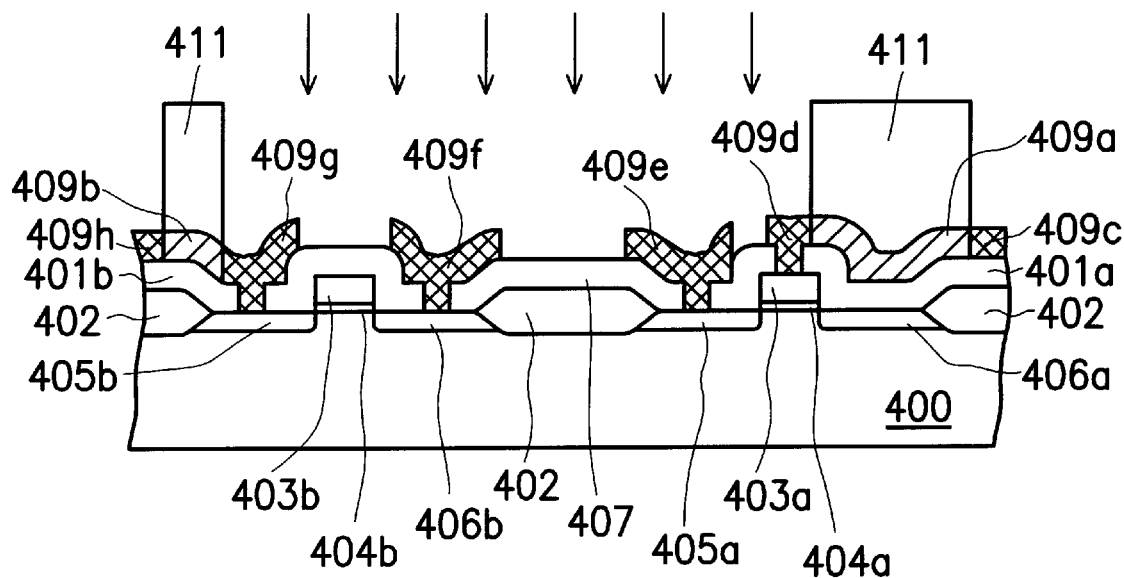

In FIG. 4E, the mask layer 410 is removed. A second mask layer 411 is formed on the refractory metal oxide layer 409. A second hydrogen treatment is performed to convert portions of the refractory metal oxide layer 409 exposed by the second mask layer 411. The converted portions become conductors with a low resistance denoted as 409c, 409d, 409e, 409f, 409g, and 409h and can be used as interconnects in a SRAM in this embodiment. As a result, the load resistors 409a and 409b and the interconnects 409c to 409h are formed with a much more planar surface of the substrate 400 compared to a conventional SRAM. The more planar surface is advantageous to the subsequent fabrication process. Moreover, in the conventional process, when a load resistor with a high resistance is required, it is often that the load resistor is formed with a reduced thickness. Consequently, the thickness of the interconnects is reduced to affect the conductivity thereof.

Figure 4F:
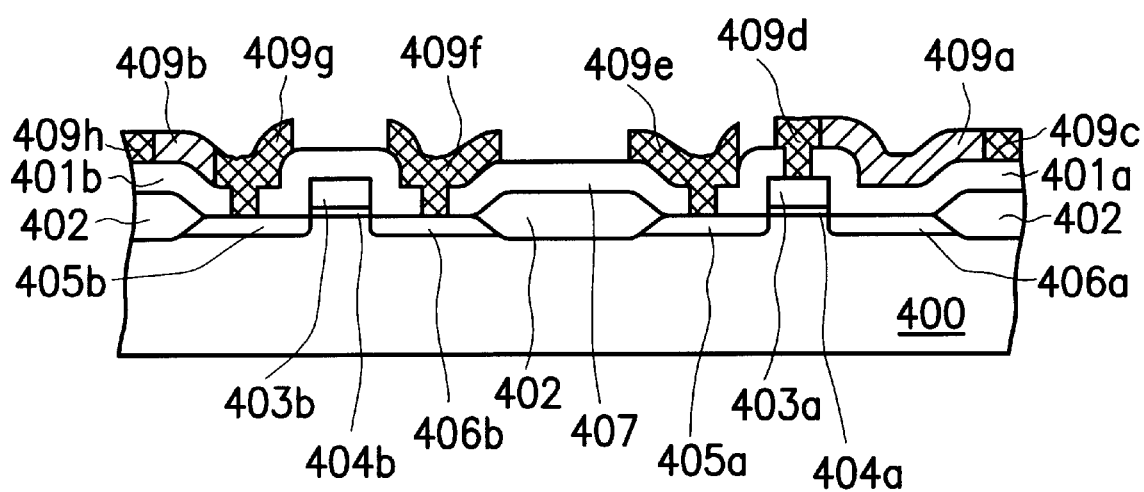

In FIG. 4F, the second mask layer is removed. In this embodiment, insulator 309i to 309k shown in FIG. 3E and FIG. 3F of the previous embodiment are removed to avoid any unwanted electrical connection or contact.

FIG. 5A to FIG. 5F shows another preferred embodiment of fabricating a load resistor of a SRAM.

Figure 5A:
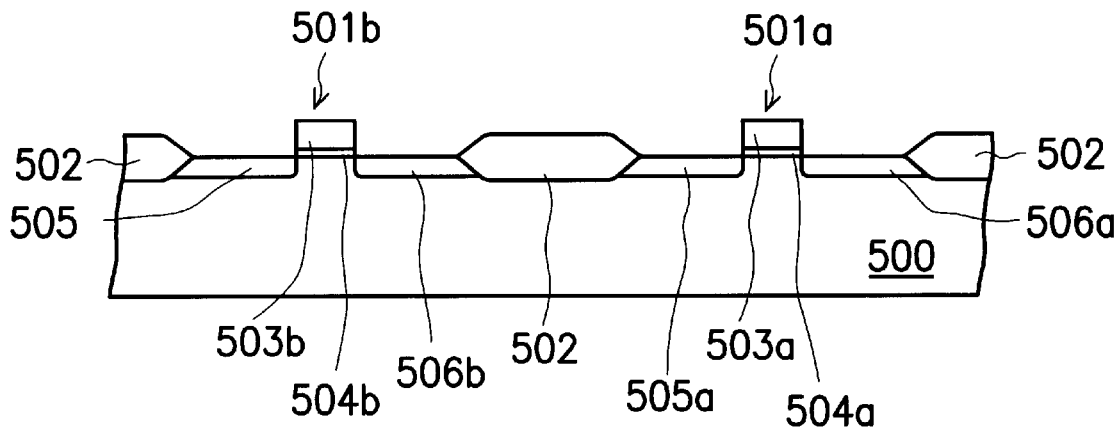

In FIG. 5A, semiconductor devices 501a, 501b, and a field oxide layer 502 are formed on a substrate 500. In this embodiment, transistors are used as an example for the semiconductor devices 501a and 501b. The transistor 501a comprises a gate 503a, a gate oxide layer 504a, and source/drain regions 505a, 506a. The transistor 501b comprises a gate 503b, a gate oxide layer 504b, and source/drain region 505b, 506b.

Figure 5B:
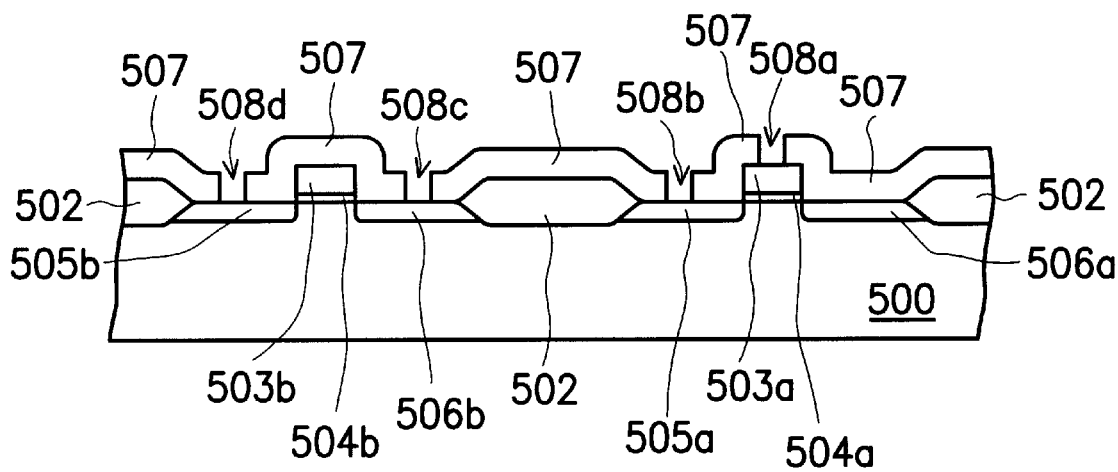

In FIG. 5B, an insulation layer 507 is formed over the substrate 500. The insulation layer comprises openings 508a, 508b, 508c, and 508d exposing the gate 503a, the source/drain regions 505a, 506b, and 505b, respectively.

Figure 5C:
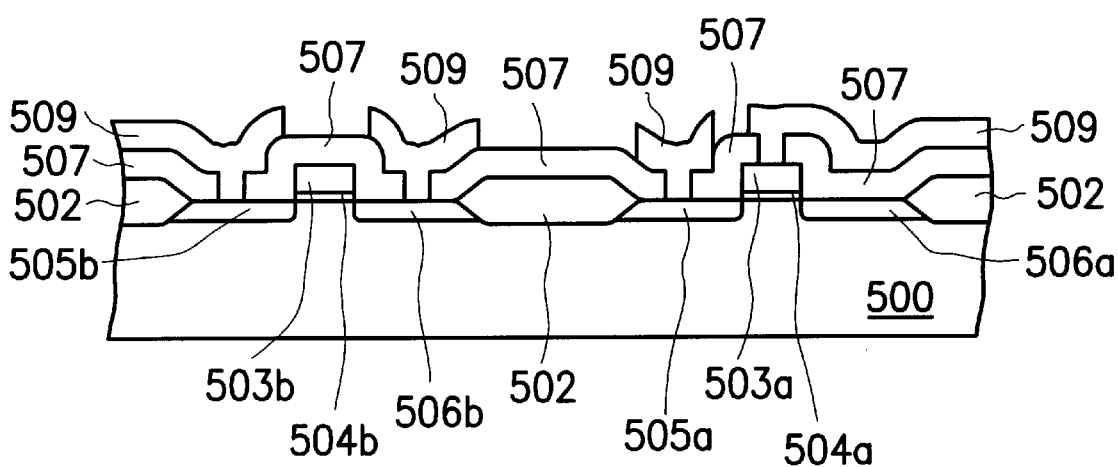

In FIG. 5C, a refractory metal oxide layer 509, for example, a $TiO_2$, $Ta_2O_5$, $Fe_2O_3$, or $BaTiO_3$ layer, is formed on the insulation layer 507. The refractory metal oxide layer 509 also fills the openings 508a, 508b, 508c, and 508d to connect with the gate 503a and the source/drain regions 505a, 506b, and 505b. Using photolithography and etching, the refractory metal oxide layer 509 is selectively removed. The removal of the refractory metal oxide layer 509 thus forms a insulator. That is, any unwanted connection between interconnects, load resistors, or the source/drain region are thus prevented. A two-step hydrogen treatment is then performed to convert the refractory metal oxide layer 509 from a high resistant material to a conductor with a higher resistance and a conductor low with a resistance. This two-step hydrogen treatment is as follows.

Figure 5D:
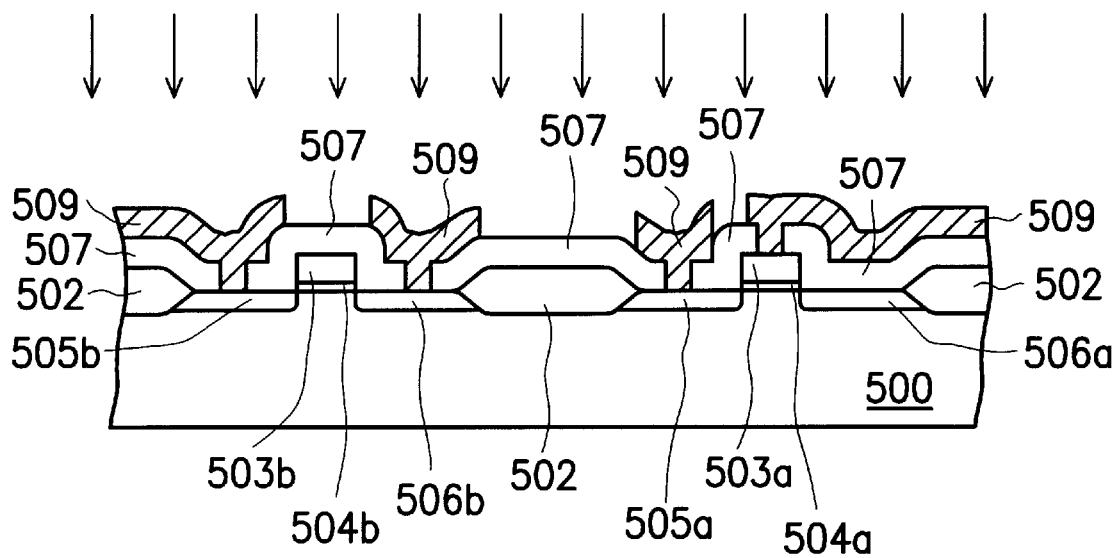

In FIG. 5D, a first step of hydrogen treatment is performed to the refractory metal oxide layer 509. Therefore, the refractory metal oxide 509 is converted from an insulator to a conductor with a high resistance.

Figure 5E:
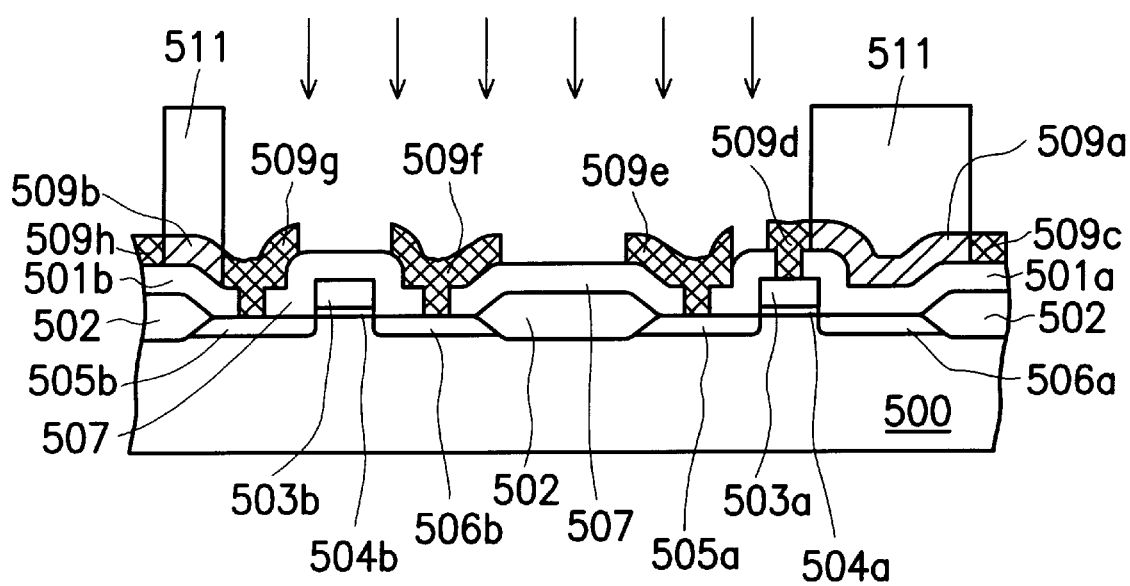
Figure 5F:
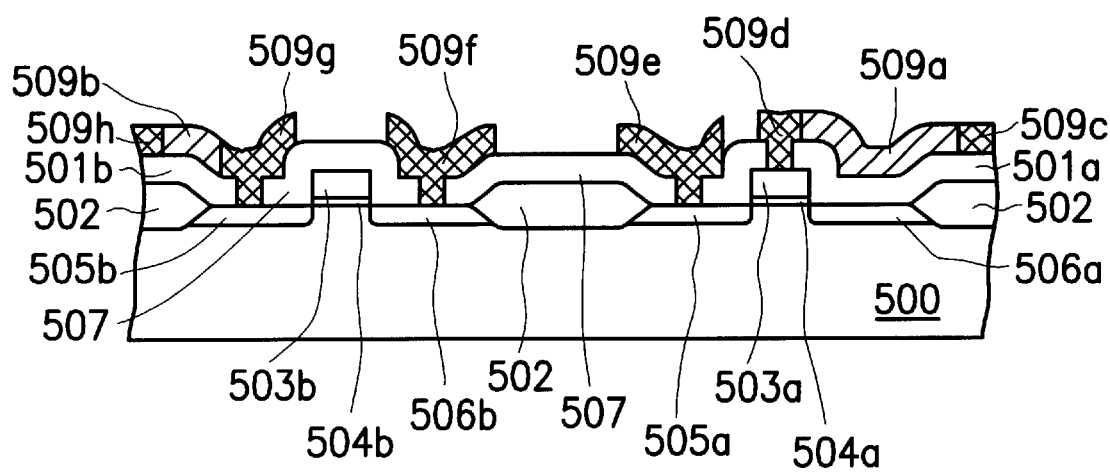

In FIG. 5E, a mask layer 511 is formed to cover portions of the refractory metal oxide layer 509 being converted by a first step of hydrogen treatment. The covered portions are denoted as 509a and 509b. A second hydrogen treatment is performed to convert portions of the refractory metal oxide layer 509c to 509h exposed by the second mask layer 511. The converted portions become conductors with a low resistance denoted as 509c, 509d, 509e, 509f, 509g, and 509h and can be used as interconnects in a SRAM in this embodiment. As a result, the portions 509a and 509b remain as conductor with a high resistance and are used as load resistors, while converted portions 509c to 509g are used as interconnects with a low resistance. The interconnects 509c to 509h are formed with a much more planar surface of the substrate 500 compared to a conventional SRAM. The more planar surface is advantageous to the subsequent fabrication process. In this embodiment, only one mask layer is required to achieve the object of forming both load resistors and local interconnects. In addition, similar to the second embodiment, the portions of refractory metal oxide layer between interconnects or load resistors are removed to avoid any undesired electrical connection or contact.

It is to be noted that the above embodiments are introduced with the examples of a SRAM cell. People skilled in the art may also apply this technique for forming both load resistors and local interconnects, or even the insulators of the same refractory metal oxide layer by using selective hydrogen treatments. While the local interconnects are formed to connect various conductive regions of a substrate, and the load resistors are formed as passive elements to construct a circuit.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a load resistor, comprising:
   providing a substrate having at least a conductive region;
   forming an insulation layer on the substrate with an opening exposing the conductive region;
   forming a refractory metal oxide layer on the insulation layer and to fill the opening;
   performing a two-step hydrogen treatment to convert a first part of the refractory metal oxide layer into a conductor with a first resistance, and to convert a second part of the refractory metal oxide layer into a conductor with a second resistance, wherein the two-step hydrogen treatment includes a first step for converting the first part and a second step for converting the second part.

2. The method according to claim 1, wherein the conductive region includes a source/drain region of a metal-oxide semiconductor device.

3. The method according to claim 1, wherein the conductive region includes a gate of a metal-oxide semiconductor device.

4. The method according to claim 1, wherein the refractory metal oxide layer is formed from a material selected from at least one of $TiO_2$, $Ta_2O_5$, $Fe_2O_3$, and $BaTiO_3$.

5. The method according to claim 1, wherein the two-step hydrogen treatment further comprises:
   forming a first mask layer with at least an opening to expose the first part of the refractory metal oxide layer;
   performing the first step of the two-step hydrogen treatment using the first mask to convert the exposed first part of the refractory metal oxide layer into the conductor with the first resistance;
   removing the first mask layer;
   forming a second mask layer to expose the second part of the refractory metal oxide layer; and
   performing the second step of the two-step hydrogen treatment to convert the exposed second part of the refractory metal oxide into the conductor with the second resistance, while a third part of the refractory metal oxide may remain as an insulator without being converted.

6. The method according to claim 5, wherein the first step of the hydrogen treatment is performed with a longer duration than the second step of the hydrogen treatment.

7. The method according to claim 1, wherein the hydrogen treatment includes a hydrogen thermal treatment.

8. The method according to claim 1, wherein the hydrogen treatment includes a hydrogen plasma treatment.

9. A method of forming a load resistor, comprising:
   providing a substrate having at least a conductive region;
   forming an insulation layer with an opening exposing the conductive region;
   forming a refractory metal oxide layer on the insulation layer to fill the opening;
   removing a part of the refractory metal oxide layer;
   converting a first remaining part of the refractory metal oxide layer into a conductor with a high resistance; and
   converting a second remaining part of the refractory metal oxide into a conductor with a low resistance.

10. The method according to claim 9, wherein the conductive region includes a source/drain region of a metal-oxide semiconductor device.

11. The method according to claim 9, wherein the conductive region includes a gate of a metal-oxide semiconductor device.

12. The method according to claim 9, wherein the refractory metal oxide layer is formed from a material selected from at least one of $TiO_2$, $Ta_2O_5$, $Fe_2O_3$, and $BaTiO_3$.

13. The method according to claim 9, wherein the steps of converting the first and the second remaining parts of the refractory metal oxide layer each include a step of hydrogen treatment.

14. The method according to claim 13, wherein the hydrogen treatment includes a hydrogen thermal treatment.

15. The method according to claim 13, wherein the hydrogen treatment includes a hydrogen plasma treatment.

16. A method of forming a load resistor, comprising:
   providing a substrate having at least a conductive region;
   forming an insulation layer with an opening exposing the conductive region;
   forming a refractory metal oxide layer on the insulation layer to fill the opening;
   removing a part of the refractory metal oxide layer;
   performing a first hydrogen treatment to the remaining refractory metal oxide layer; and
   performing a second hydrogen treatment to a part of the refractory metal oxide layer.

17. The method according to claim 16, wherein the conductive region includes a gate of a metal-oxide semiconductor device.

18. The method according to claim 16, wherein the refractory metal oxide layer is formed from a material selected from at least one of a group consisting of $TiO_2$, $Ta_2O_5$, $Fe_2O_3$, and $BaTiO_3$.

19. The method according to claim 16, wherein each of the first and the second hydrogen treatments includes a hydrogen plasma treatment.

20. The method according to claim 16, wherein each of the first and the second hydrogen treatments includes a hydrogen thermal treatment.

21. A method of forming a load resistor of a static random access memory, comprising:
   providing a substrate having at least a metal-oxide semiconductor device which comprises a source/drain region and a gate;
   forming an insulation layer with openings exposing the gate and the source/drain region;
   forming a refractory metal oxide layer on the insulation layer and to fill the openings;
   performing a first step of a hydrogen treatment with a first mask to convert a first part of the refractory metal oxide layer into a first conductor with a first conductivity; and
   performing a second step of the hydrogen treatment with a second mask to convert a second part of a refractory metal oxide layer into a second conductor with a second conductivity, while a third part of the refractory metal oxide layer may remain as an insulator without being converted.

22. The method according to claim 21, wherein a relative difference between the first conductivity and the second conductivity is adjusted by controlling an oxygen content in the refractory metal oxide layer through the first step and the second step of hydrogen treatment.

* * * * *